(12) United States Patent
Haase

(10) Patent No.: US 7,541,610 B2
(45) Date of Patent: Jun. 2, 2009

(54) LED DEVICE WITH RE-EMITTING SEMICONDUCTOR CONSTRUCTION AND CONVERGING OPTICAL ELEMENT

(75) Inventor: Michael A. Haase, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 11/761,067

(22) Filed: Jun. 11, 2007

(65) Prior Publication Data

US 2008/0006832 A1    Jan. 10, 2008

Related U.S. Application Data

(60) Provisional application No. 60/804,544, filed on Jun. 12, 2006.

(51) Int. Cl.
*H01L 29/06* (2006.01)
*H01L 31/0328* (2006.01)
*H01L 31/0336* (2006.01)
*H01L 31/072* (2006.01)
*H01L 31/109* (2006.01)
*H01L 29/18* (2006.01)
*H01L 33/00* (2006.01)
*H01L 29/20* (2006.01)
*H01L 29/201* (2006.01)
*H01L 29/22* (2006.01)
*H01L 29/227* (2006.01)
*H01L 29/24* (2006.01)

(52) U.S. Cl. .............. 257/13; 257/14; 257/15; 257/16; 257/17; 257/18; 257/19; 257/20; 257/21; 257/22; 257/23; 257/24; 257/25; 257/88; 257/89; 257/90; 257/95; 257/98; 257/103

(58) Field of Classification Search ............ 257/13–252
See application file for complete search history.

(56) References Cited

U.S. PATENT DOCUMENTS 5,087,949 A    2/1992  Haitz
5,252,839 A    10/1993 Fouquet (Continued)

FOREIGN PATENT DOCUMENTS

JP      2004-072047      3/2004

(Continued)

OTHER PUBLICATIONS

U.S. Appl. No. 11/761,078, filed Jun. 11, 2007, Titled "LED Device with Re-emitting Semiconductor Construction and Optical Element."

(Continued)

*Primary Examiner*—Ida M Soward
(74) *Attorney, Agent, or Firm*—Robert S. Moshrefzadeh

(57) ABSTRACT

A light source is provided including an LED component having an emitting surface, which may include: i) an LED capable of emitting light at a first wavelength; and ii) a re-emitting semiconductor construction which includes a second potential well not located within a pn junction having an emitting surface; or which may alternately include a first potential well located within a pn junction and a second potential well not located within a pn junction; and which additionally includes a converging optical element.

10 Claims, 9 Drawing Sheets

U.S. PATENT DOCUMENTS

| | | | |
|---|---|---|---|
| 5,814,839 A * | 9/1998 | Hosoba | 257/96 |
| 5,851,905 A | 12/1998 | McIntosh et al. | |
| 5,915,193 A | 6/1999 | Tong et al. | |
| 5,955,749 A | 9/1999 | Joannopoulos et al. | |
| 5,998,925 A | 12/1999 | Shimizu et al. | |
| 6,054,719 A * | 4/2000 | Fusser et al. | 257/14 |
| 6,091,083 A * | 7/2000 | Hata et al. | 257/79 |
| 6,292,576 B1 | 9/2001 | Brownlee | |
| 6,303,404 B1 | 10/2001 | Moon et al. | |
| 6,328,456 B1 | 12/2001 | Mize | |
| 6,337,536 B1 | 1/2002 | Matsubara et al. | |
| 6,473,554 B1 | 10/2002 | Pelka et al. | |
| 6,476,412 B1 | 11/2002 | Kano | |
| 6,504,171 B1 | 1/2003 | Grillot et al. | |
| 6,563,133 B1 | 5/2003 | Tong | |
| 6,610,598 B2 | 8/2003 | Chen | |
| 6,618,420 B1 * | 9/2003 | Gen-Ei et al. | 372/50.1 |
| 6,649,939 B1 | 11/2003 | Wirth | |
| 6,717,362 B1 | 4/2004 | Lee et al. | |
| 6,720,730 B2 | 4/2004 | Salam | |
| 6,734,467 B2 | 5/2004 | Schlereth et al. | |
| 6,824,660 B2 * | 11/2004 | Tomita | 204/416 |
| 6,849,881 B1 | 2/2005 | Harle et al. | |
| 6,924,512 B2 | 8/2005 | Tsuda et al. | |
| 7,009,210 B2 * | 3/2006 | Sarathy et al. | 257/98 |
| 7,045,375 B1 | 5/2006 | Wu et al. | |
| 7,135,073 B2 * | 11/2006 | Heuken et al. | 117/86 |
| 7,266,279 B1 * | 9/2007 | Yap et al. | 385/131 |
| 7,304,425 B2 | 12/2007 | Ouderkirk et al. | |
| 2002/0030194 A1 | 3/2002 | Camras et al. | |
| 2002/0041148 A1 | 4/2002 | Cho et al. | |
| 2002/0134989 A1 | 9/2002 | Yao et al. | |
| 2003/0111667 A1 | 6/2003 | Schubert | |
| 2003/0178626 A1 * | 9/2003 | Sugiyama et al. | 257/79 |
| 2004/0072047 A1 | 4/2004 | Markoski et al. | |
| 2004/0075102 A1 | 4/2004 | Chen et al. | |
| 2005/0007793 A1 | 1/2005 | Yoshida et al. | |
| 2005/0023545 A1 | 2/2005 | Camras et al. | |
| 2005/0039788 A1 | 2/2005 | Blieske et al. | |
| 2005/0082562 A1 * | 4/2005 | Ou et al. | 257/103 |
| 2006/0091411 A1 | 5/2006 | Ouderkirk et al. | |
| 2006/0091414 A1 | 5/2006 | Ouderkirk et al. | |
| 2006/0091784 A1 | 5/2006 | Conner et al. | |
| 2006/0092532 A1 | 5/2006 | Ouderkirk et al. | |
| 2006/0094322 A1 | 5/2006 | Ouderkirk et al. | |
| 2006/0094340 A1 | 5/2006 | Ouderkirk et al. | |
| 2006/0124917 A1 | 6/2006 | Miller et al. | |
| 2006/0124918 A1 | 6/2006 | Miller et al. | |
| 2007/0008257 A1 * | 1/2007 | Seo et al. | 345/83 |
| 2007/0116423 A1 | 5/2007 | Leatherdale et al. | |
| 2007/0256453 A1 | 11/2007 | Barnes et al. | |
| 2007/0257266 A1 | 11/2007 | Leatherdale et al. | |
| 2007/0257267 A1 | 11/2007 | Leatherdale et al. | |
| 2007/0257270 A1 | 11/2007 | Lu et al. | |
| 2007/0257271 A1 | 11/2007 | Ouderkirk et al. | |
| 2007/0258246 A1 | 11/2007 | Leatherdale et al. | |

FOREIGN PATENT DOCUMENTS

| | | |
|---|---|---|
| WO | WO 2005/038937 | 4/2005 |

OTHER PUBLICATIONS

U.S. Appl. No. 11/761,144, filed Jun. 11, 2007, Titled "LED Device with Re-emitting Semiconductor Construction and Converging Optical Element."

U.S. Appl. No. 11/755,010, filed May 30, 2007, Titled "Adapted LED Device with Re-emitting Semiconductor Construction."

Dalmasso et al., Injection Dependence of the Electroluminescence Spectra of Re-emitting semiconductor construction Free GaN-Based White Light Emitting Diodes, *Phys. Stat. Sol.* (a), vol. 192, No. 1, pp. 139-143 (2003).

Damilano et al., Monolithic White Light Emitting Diodes Based on InGaN/GaN Multiple-Quantum Wells. *Japanese Journal of Applied Physics*, vol. 40, pp. L918-L920 (2001).

Kroemer, *Quantum Mechanics for Engineering, Materials Science and Applied Physics* Prentice Hall, Englewood Cliffs, NJ, pp. 54-63, (1994).

Luo et al., Patterned three-color ZnCdASe/ZnCdMgSe quantum-well structures for integrated full-color and white light emitters, *Applied Physics Letters*, vol. 77, No. 26, pp. 4259-4261 (2000).

Murai et al., Wafer Bonding of GaN and ZnSSe for Optoelectronic Applications, *Japanese Journal of Applied Physics*, vol. 43 No. 10A, p. L1275 (2004).

Tong et al., *Semiconductor Wafer Bonding*, John Wiley & Sons, NY, pp. 49-101 (1999).

Tong et al., *Semiconductor Wafer Bonding*, John Wiley & Sons, NY, pp. 223-232 (1999).

Yamada et al., Phosphor Free High-Luminous-Efficiency White Light-Emitting Diodes Composed of InGaN Multi-Quantum Well, *Japanese Journal of Applied Physics*. vol. 41 pp. L246-248 (2002).

Zory, *Quantum Well Lasers*, Academic Press, San Diego, CA, pp. 72-79 (1993).

* cited by examiner

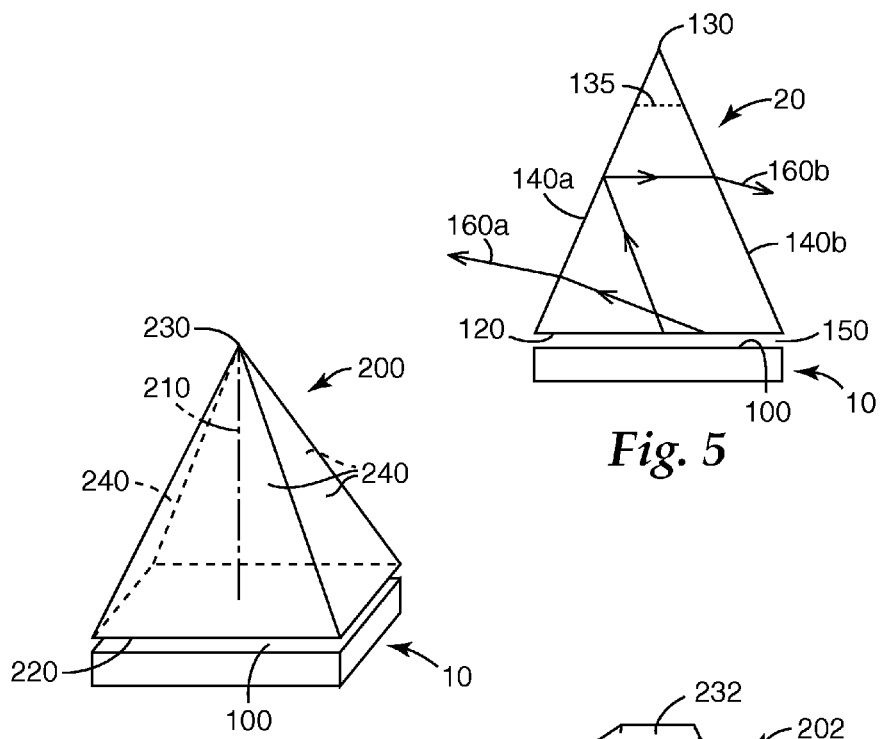
*Fig. 5*
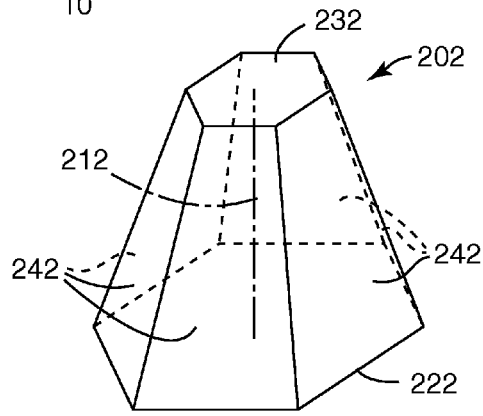
*Fig. 6a*
*Fig. 6b*
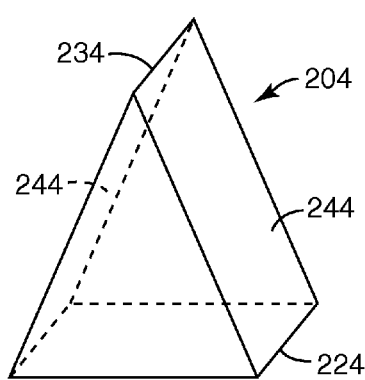
*Fig. 6c*

LED DEVICE WITH RE-EMITTING SEMICONDUCTOR CONSTRUCTION AND CONVERGING OPTICAL ELEMENT

CROSS REFERENCE TO RELATED APPLICATIONS

This application claims the benefit of U.S. Provisional Patent Application No. 60/804,544, filed Jun. 12, 2006, the disclosure of which is incorporated by reference herein in its entirety.

The following co-owned and currently pending U.S. patent applications are incorporated herein by reference: U.S. Ser. Nos. 11/009,217; 11/009,241; 11/381,293; 11/381,324; 11/381,329; 11/381,332; 11/381,984; 10/977,241 and 11/381,518.

FIELD OF THE DISCLOSURE

The present invention relates to light sources. More particularly, the present invention relates to light sources including a light emitting diode (LED), a re-emitting semiconductor construction and a converging optical element as described herein.

BACKGROUND OF THE DISCLOSURE

Light emitting diodes (LED's) are solid-state semiconductor devices which emit light when an electrical current is passed between anode and cathode. Conventional LED's contain a single pn junction. The pn junction may include an intermediate undoped region; this type of pn junction may also be called a pin junction. Like non-light emitting semiconductor diodes, conventional LED's pass an electrical current much more readily in one direction, i.e., in the direction where electrons are moving from the n-region to the p-region. When a current passes in the "forward" direction through the LED, electrons from the n-region recombine with holes from the p-region, generating photons of light. The light emitted by a conventional LED is monochromatic in appearance; that is, it is generated in a single narrow band of wavelengths. The wavelength of the emitted light corresponds to the energy associated with electron-hole pair recombination. In the simplest case, that energy is approximately the band gap energy of the semiconductor in which the recombination occurs.

Conventional LED's may additionally contain one or more quantum wells at the pn junction which capture high concentrations of both electrons and holes, thereby enhancing light-producing recombination. Several investigators have attempted to produce an LED device which emits white light, or light which appears white to the 3-color perception of the human eye.

Some investigators report the purported design or manufacture of LED's having multiple quantum wells within the pn junction, where the multiple quantum wells are intended to emit light at different wavelengths. The following references may be relevant to such a technology: U.S. Pat. Nos. 5,851,905; 6,303,404; 6,504,171; 6,734,467; Damilano et al., *Monolithic White Light Emitting Diodes Based on InGaN/GaN Multiple-Quantum Wells*, Jpn. J. Appl. Phys. Vol. 40 (2001) pp. L918-L920; Yamada et al., *Re-emitting semiconductor construction Free High-Luminous-Efficiency White Light-Emitting Diodes Composed of InGaN Multi-Quantum Well*, Jpn. J. Appl. Phys. Vol. 41 (2002) pp. L246-L248; Dalmasso et al., *Injection Dependence of the Electroluminescence Spectra of Re-emitting semiconductor construction Free GaN-Based White Light Emitting Diodes*, phys. stat. sol. (a) 192, No. 1, 139-143 (2003).

Some investigators report the purported design or manufacture of LED devices which combine two conventional LED's, intended to independently emit light at different wavelengths, in a single device. The following references may be relevant to such a technology: U.S. Pat. Nos. 5,851,905; 6,734,467; U.S. Pat. Pub. No. 2002/0041148 A1; U.S. Pat. Pub. No. 2002/0134989 A1; and Luo et al., *Patterned three-color ZnCdSe/ZnCdMgSe quantum-well structures for integrated full-color and white light emitters*, App. Phys. Letters, vol. 77, no. 26, pp. 4259-4261 (2000).

Some investigators report the purported design or manufacture of LED devices which combine a conventional LED element with a chemical re-emitting semiconductor construction, such as yttrium aluminum garnet (YAG), which is intended to absorb a portion of the light emitted by the LED element and re-emit light of a longer wavelength. U.S. Pat. Nos. 5,998,925 and 6,734,467 may be relevant to such a technology.

Some investigators report the purported design or manufacture of LED's grown on a ZnSe substrate n-doped with I, Al, Cl, Br, Ga or In so as to create fluorescing centers in the substrate, which are intended to absorb a portion of the light emitted by the LED element and re-emit light of a longer wavelength. U.S. Pat. No. 6,337,536 and Japanese Pat. App. Pub. No. 2004-072047 may be relevant to such a technology.

US Pat. Pub. No. 2005/0023545 is incorporated herein by reference.

SUMMARY OF THE DISCLOSURE

Briefly, the present disclosure provides a light source comprising an LED component having an emitting surface, which may comprise: i) an LED capable of emitting light at a first wavelength; and ii) a re-emitting semiconductor construction which comprises a second potential well not located within a pn junction having an emitting surface; or which may alternately comprise a first potential well located within a pn junction and a second potential well not located within a pn junction. In one embodiment, the light source additionally comprises an optical element having a base, two converging sides, and two diverging sides, wherein the base is optically coupled to the emitting surface. In another embodiment, the light source additionally comprises a high index optical element optically coupled to the LED component and shaped to direct light emitted by the LED component to produce a side emitting pattern having two lobes. In another embodiment, the light source additionally comprises an optical element including a base, an apex smaller than the base, and a converging side extending between the base and the apex, wherein the base is optically coupled to and is no greater in size than the emitting surface; wherein the optical element directs light emitted by the LED component to produce a side emitting pattern. In another embodiment, the light source additionally comprises an optical element including a base, an apex, and a converging side joining the base and the apex, wherein the base is optically coupled to the emitting surface; wherein the optical element comprises a first section including the base and that is composed of a first material; and wherein the optical element comprises a second section including the apex and that is composed of a second material. In another embodiment, the light source additionally comprises a first optical element including a base, an apex, and a converging side joining the base and the apex, wherein the base is optically coupled to and is no greater in size than the emitting surface, the first optical element having a first index of refraction; and a second optical element encapsulating the LED component and the first optical element, the second optical element having a second index of refraction lower than the first index of refraction. In another embodiment, the light source additionally comprises a first optical element including a base, an apex residing over the emitting surface, and a converging side joining the base and the apex, wherein the base is optically coupled to the emitting surface, the first optical element having a first index of refraction; and a second optical element encapsulating the LED component and the first optical element, the second optical element having a second index of refraction lower than the first index of refraction. In another embodiment, the light source additionally comprises a first optical element including a base, an apex, and a converging side joining the base and the apex, wherein the base is optically coupled to the emitting surface; and a second optical element encapsulating the LED component and the first optical element, the second optical element providing an increase in power extracted from the LED component as compared to the power extracted by first optical element alone. In another embodiment, the light source additionally comprises an optical element including a base, an apex, and a side joining the base and the apex, wherein the base is optically coupled to and mechanically decoupled from the emitting surface.

In another aspect, the present invention provides a graphic display device comprising the LED device according to the present invention.

In another aspect, the present invention provides an illumination device comprising the LED device according to the present invention.

In this application:

with regard to a stack of layers in a semiconductor device, "immediately adjacent" means next in sequence without intervening layers, "closely adjacent" means next in sequence with one or a few intervening layers, and "surrounding" means both before and after in sequence;

"potential well" means a layer of semiconductor in a semiconductor device which has a lower conduction band energy than surrounding layers or a higher valence band energy than surrounding layers, or both;

"quantum well" means a potential well which is sufficiently thin that quantization effects raise the electron-hole pair transition energy in the well, typically having a thickness of 100 nm or less;

"transition energy" means electron-hole recombination energy;

"lattice-matched" means, with reference to two crystalline materials, such as an epitaxial film on a substrate, that each material taken in isolation has a lattice constant, and that these lattice constants are substantially equal, typically not more than 0.2% different from each other, more typically not more than 0.1% different from each other, and most typically not more than 0.01% different from each other; and "pseudomorphic" means, with reference to a first crystalline layer of given thickness and a second crystalline layer, such as an epitaxial film and a substrate, that each layer taken in isolation has a lattice constant, and that these lattice constants are sufficiently similar so that the first layer, in the given thickness, can adopt the lattice spacing of the second layer in the plane of the layer substantially without misfit defects.

It should be understood that, for any embodiment of the present invention described herein comprising n-doped and p-doped semiconductor regions, a further embodiment should be considered as disclosed herein wherein n doping is exchanged with p doping and vice-versa.

It should be understood that, where each of "potential well," "first potential well," "second potential well" and "third potential well" are recited herein, a single potential well may be provided or multiple potential wells, which typically share similar properties, may be provided. Likewise, it should be understood that, where each of "quantum well," "first quantum well," "second quantum well" and "third quantum well" are recited herein, a single quantum well may be provided or multiple quantum wells, which typically share similar properties, may be provided.

BRIEF DESCRIPTION OF THE DRAWINGS

FIG. 5 is a schematic side view illustrating an optical element and LED component configuration in one embodiment.

FIGS. 6*a-c* are perspective views of an optical element according to additional embodiments.

DETAILED DESCRIPTION

Figure 1:
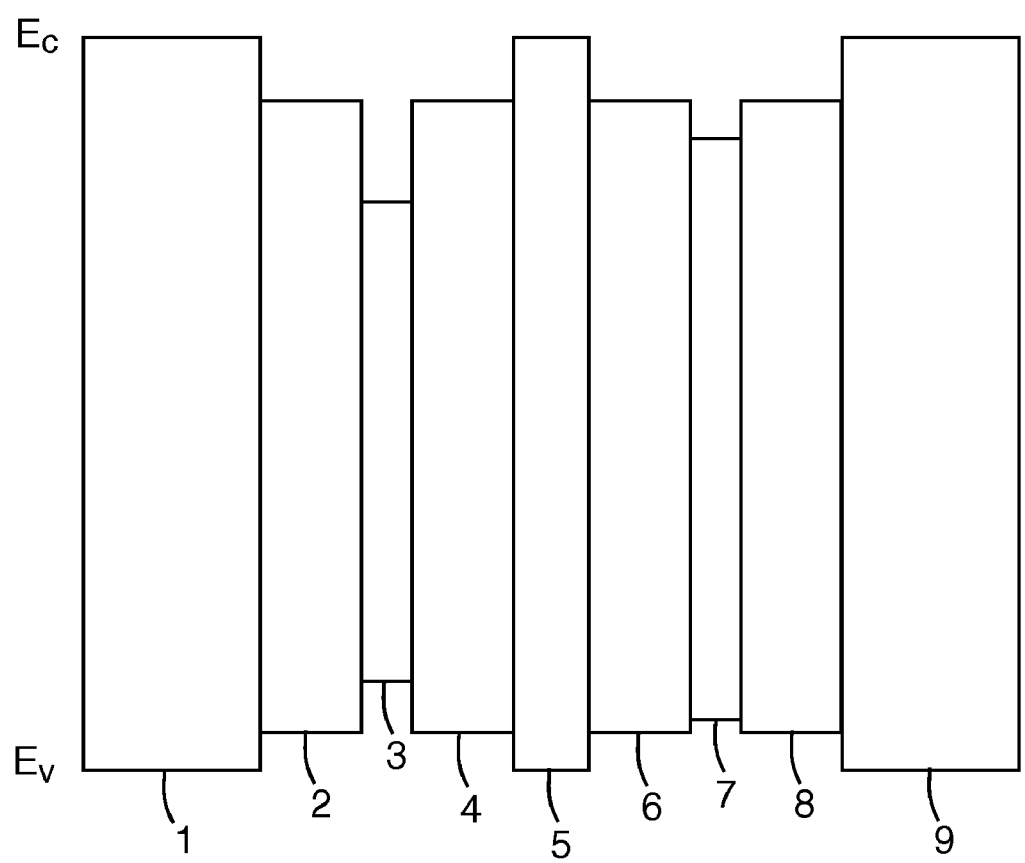
FIG. 1 is a flat-band diagram of conduction and valence bands of semiconductors in a construction according to one embodiment of the present invention. Layer thickness is not represented to scale.

The present invention provides a device comprising: an LED; a re-emitting semiconductor construction and a extractor. Typically the LED is capable of emitting light at a first wavelength and the a re-emitting semiconductor construction is capable of absorbing light at that first wavelength and re-emitting light at a second wavelength. The a re-emitting semiconductor construction comprises a potential well not located within a pn junction. The potential wells of the re-emitting semiconductor construction are typically but not necessarily quantum wells.

In typical operation, the LED emits photons in response to an electric current and the re-emitting semiconductor construction emits photons in response to the absorption of a portion of the photons emitted from the LED. In one embodiment, the re-emitting semiconductor construction additionally comprises an absorbing layer closely or immediately adjacent to the potential well. Absorbing layers typically have a band gap energy which is less than or equal to the energy of photons emitted by the LED and greater than the transition energy of the potential wells of the re-emitting semiconductor construction. In typical operation the absorbing layers assist absorption of photons emitted from the LED. In one embodiment, the re-emitting semiconductor construction additionally comprises at least one second potential well not located within a pn junction having a second transition energy not equal to the transition energy of the first potential well. In one embodiment, the LED is a UV LED. In one such embodiment, the re-emitting semiconductor construction comprises at least one first potential well not located within a pn junction having a first transition energy corresponding to blue-wavelength light, at least one second potential well not located within a pn junction having a second transition energy corresponding to green-wavelength light, and at least one third potential well not located within a pn junction having a third transition energy corresponding to red-wavelength light. In one embodiment, the LED is a visible light LED, typically a green, blue or violet LED, more typically a green or blue LED, and most typically a blue LED. In one such embodiment, the re-emitting semiconductor construction comprises at least one first potential well not located within a pn junction having a first transition energy corresponding to yellow- or green-wavelength light, more typically green-wavelength light, and at least one second potential well not located within a pn junction having a second transition energy corresponding to orange- or red-wavelength light, more typically red-wavelength light. The re-emitting semiconductor construction may comprise additional potential wells and additional absorbing layers.

Any suitable LED may be used in the practice of the present invention. Elements of the device according to the present invention, including the LED and the re-emitting semiconductor construction, may be composed of any suitable semiconductors, including Group IV elements such as Si or Ge (other than in light-emitting layers), III-V compounds such as InAs, AlAs, GaAs, InP, AlP, GaP, InSb, AlSb, GaSb, and alloys thereof, II-VI compounds such as ZnSe, CdSe, BeSe, MgSe, ZnTe, CdTe, BeTe, MgTe, ZnS, CdS, BeS, MgS and alloys thereof, or alloys of any of the above. Where appropriate, the semiconductors may be n-doped or p-doped by any suitable method or by inclusion of any suitable dopant. In one typical embodiment, the LED is a III-V semiconductor device and the re-emitting semiconductor construction is a II-VI semiconductor device.

Figure 2:
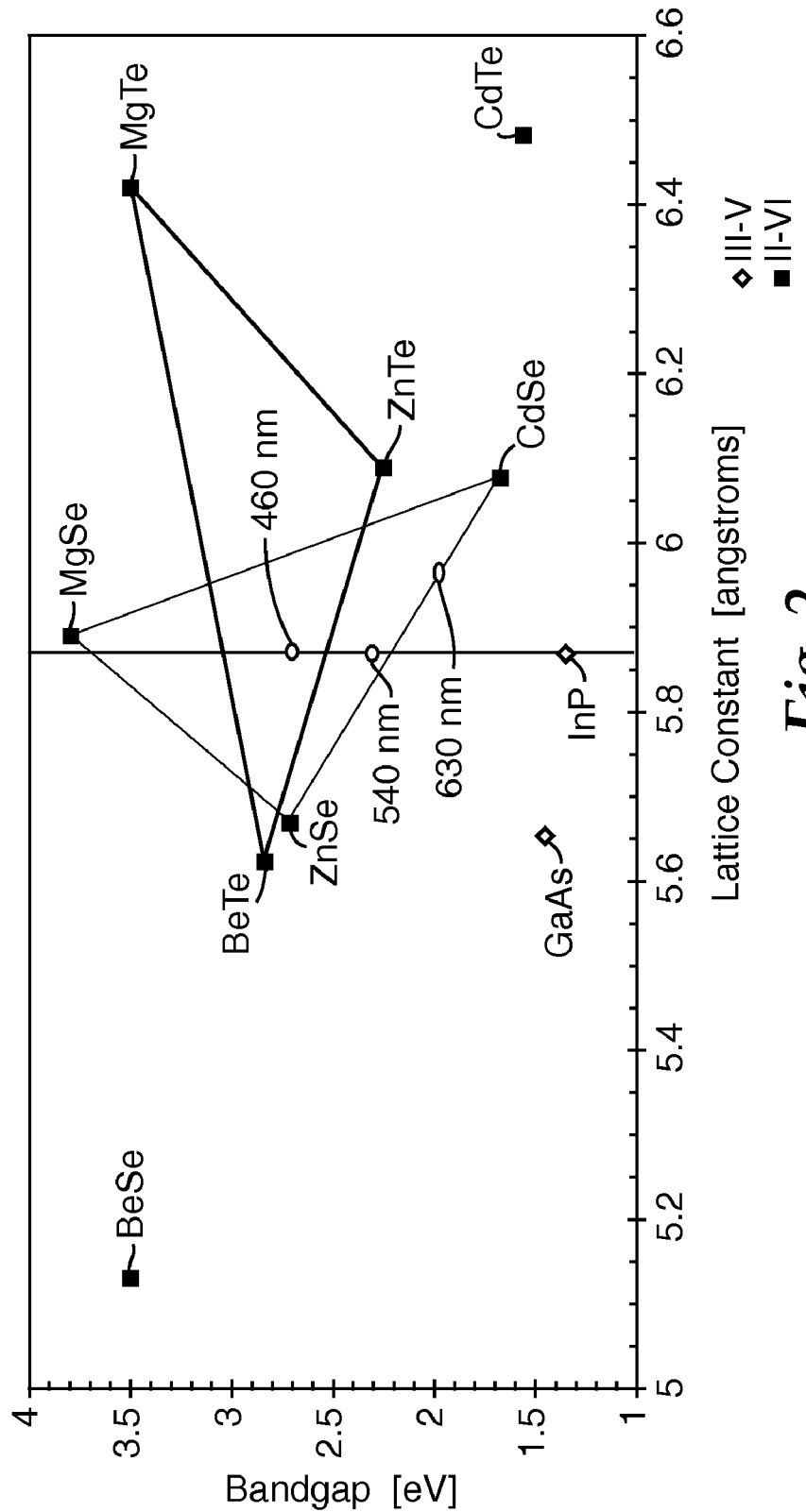
FIG. 2 is a graph indicating lattice constant and band gap energy for a variety of II-VI binary compounds and alloys thereof.

In one embodiment of the present invention, the compositions of the various layers of a component of the device, such the LED or the re-emitting semiconductor construction, are selected in light of the following considerations. Each layer typically will be pseudomorphic to the substrate at the thickness given for that layer or lattice matched to the substrate. Alternately, each layer may be pseudomorphic or lattice matched to immediately adjacent layers. Potential well layer materials and thicknesses are typically chosen so as to provide a desired transition energy, which will correspond to the wavelength of light to be emitted from the quantum well. For example, the points labeled 460 nm, 540 nm and 630 nm in FIG. 2 represent Cd(Mg)ZnSe alloys having lattice constants close to that for an InP substrate (5.8687 Angstroms or 0.58687 nm) and band gap energies corresponding to wavelengths of 460 nm (blue), 540 nm (green) and 630 nm (red). Where a potential well layer is sufficiently thin that quantization raises the transition energy above the bulk band gap energy in the well, the potential well may be regarded as a quantum well. The thickness of each quantum well layer will determine the amount of quantization energy in the quantum well, which is added to the bulk band gap energy to determine the transition energy in the quantum well. Thus, the wavelength associated with each quantum well can be tuned by adjustment of the quantum well layer thickness. Typically thicknesses for quantum well layers are between 1 nm and 100 nm, more typically between 2 nm and 35 nm. Typically the quantization energy translates into a reduction in wavelength of 20 to 50 nm relative to that expected on the basis of the band gap energy alone. Strain in the emitting layer may also change the transition energy for potential wells and quantum wells, including the strain resulting from the imperfect match of lattice constants between pseudomorphic layers.

Techniques for calculating the transition energy of a strained or unstrained potential well or quantum well are known in the art, e.g., in Herbert Kroemer, *Quantum Mechanics for Engineering Materials Science and Applied Physics* (Prentice Hall, Englewood Cliffs, N.J., 1994) at pp. 54-63; and Zory, ed., *Quantum Well Lasers* (Academic Press, San Diego, Calif., 1993) at pp. 72-79; both incorporated herein by reference.

Any suitable emission wavelengths may be chosen, including those in the infrared, visible, and ultraviolet bands. In one embodiment of the present invention, the emission wavelengths are chosen so that the combined output of light emitted by the device creates the appearance of any color that can be generated by the combination of two, three or more monochromatic light sources, including white or near-white colors, pastel colors, magenta, cyan, and the like. In another embodiment, the device according to the present invention emits light at an invisible infrared or ultraviolet wavelength and at a visible wavelength as an indication that the device is in operation. Typically the LED emits photons of the shortest wavelength, so that photons emitted from the LED have sufficient energy to drive the potential wells in the re-emitting semiconductor construction. In one typical embodiment, the LED is a III-V semiconductor device, such as a blue-emitting GaN-based LED, and re-emitting semiconductor construction is a II-VI semiconductor device.

FIG. 1 is a band diagram representing conduction and valence bands of semiconductors in a re-emitting semiconductor construction according to one embodiment of the present invention. Layer thickness is not represented to scale. Table I indicates the composition of layers 1-9 in this embodiment and the band gap energy ($E_g$) for that composition. This construction may be grown on an InP substrate.

TABLE I

| Layer | Composition | Band gap Energy ($E_g$) |
|---|---|---|
| 1 | $Cd_{0.24}Mg_{0.43}Zn_{0.33}Se$ | 2.9 eV |
| 2 | $Cd_{0.35}Mg_{0.27}Zn_{0.38}Se$ | 2.6 eV |
| 3 | $Cd_{0.70}Zn_{0.30}Se$ | 1.9 eV |
| 4 | $Cd_{0.35}Mg_{0.27}Zn_{0.38}Se$ | 2.6 eV |
| 5 | $Cd_{0.24}Mg_{0.43}Zn_{0.33}Se$ | 2.9 eV |
| 6 | $Cd_{0.35}Mg_{0.27}Zn_{0.38}Se$ | 2.6 eV |
| 7 | $Cd_{0.33}Zn_{0.67}Se$ | 2.3 eV |
| 8 | $Cd_{0.35}Mg_{0.27}Zn_{0.38}Se$ | 2.6 eV |
| 9 | $Cd_{0.24}Mg_{0.43}Zn_{0.33}Se$ | 2.9 eV |

Layer 3 represents a single potential well which is a red-emitting quantum well having a thickness of about 10 nm. Layer 7 represents a single potential well which is a green-emitting quantum well having a thickness of about 10 nm. Layers 2, 4, 6 and 8 represent absorbing layers, each having a thickness of about 1000 nm. Layers 1, 5 and 9 represent support layers. Support layers are typically chosen so as to be substantially transparent to light emitted from quantum wells 3 and 7 and from short-wavelength LED 20. Alternately, the device may comprise multiple red- or green-emitting potential wells or quantum wells separated by absorbing layers and/or support layers.

Figure 3:
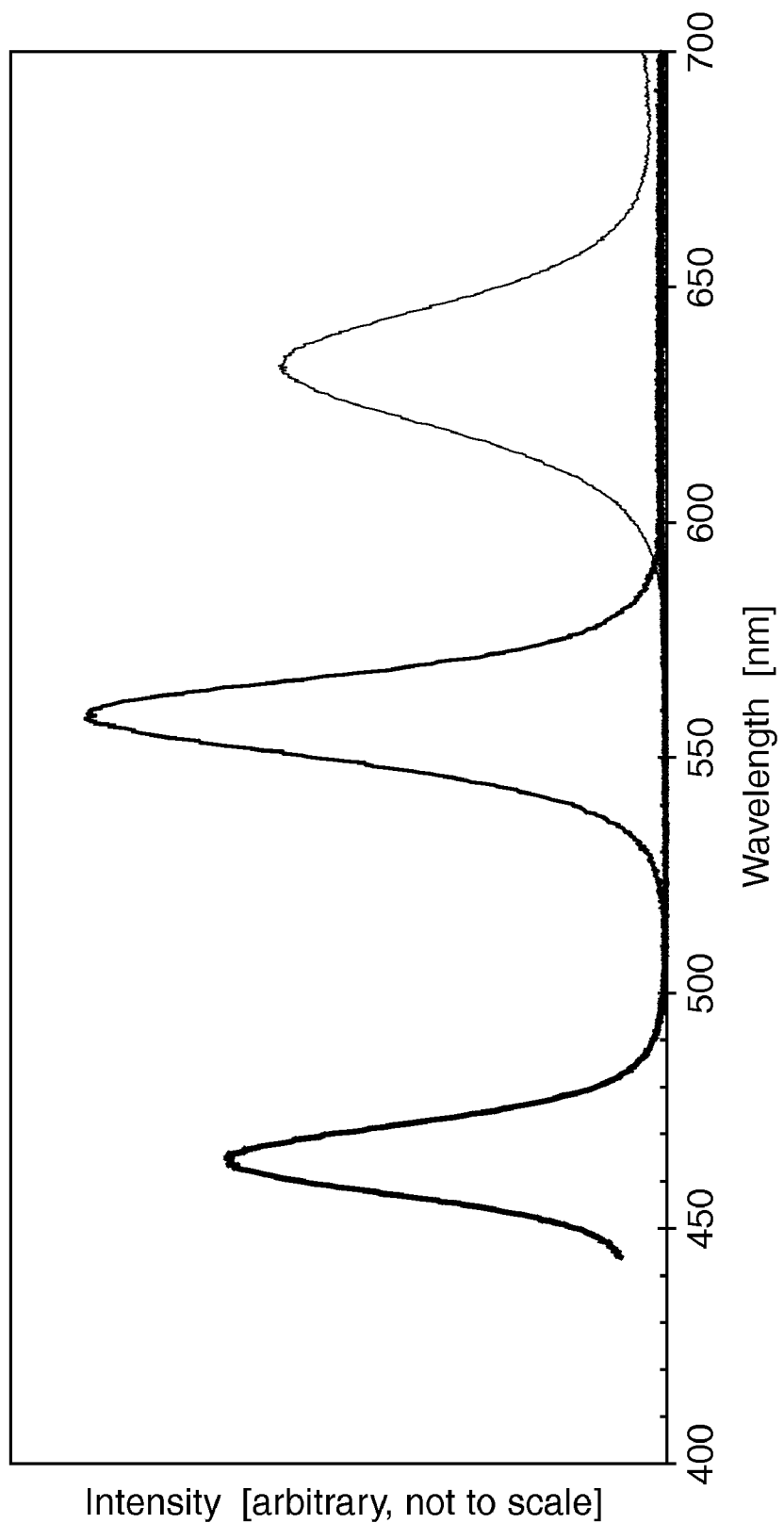
FIG. 3 is a graph representing the spectrum of light that emits from a device according to one embodiment of the present invention.

Without wishing to be bound by theory, it is believed that the embodiment of the present invention represented by FIG. 1 operates according to the following principles: Blue wavelength photons emitted by the LED and impinging upon the re-emitting semiconductor construction may be absorbed and re-emitted from the green-emitting quantum well 7 as green-wavelength photons or from the red-emitting quantum well 3 as red-wavelength photons. The absorption of a short-wavelength photon generates an electron-hole pair which may then recombine in the quantum wells, with the emission of a photon. The polychromatic combination of blue-, green- and red-wavelength light emitted from the device may appear white or near-white in color. The intensity of blue-, green- and red-wavelength light emitted from the device may be balanced in any suitable manner, including manipulation of the number of quantum wells of each type, the use of filters or reflective layers, and manipulation of the thickness and composition of absorbing layers. FIG. 3 represents a spectrum of light that emits from one embodiment of the device according to the present invention.

Again with reference to the embodiment represented by FIG. 1, absorbing layers 2, 4, 5 and 8 may be adapted to absorb photons emitted from the LED by selecting a band gap energy for the absorbing layers that is intermediate between the energy of photons emitted from the LED and the transition energies of quantum wells 3 and 7. Electron-hole pairs generated by absorption of photons in the absorbing layers 2, 4, 6 and 8 are typically captured by the quantum wells 3 and 7 before recombining with concomitant emission of a photon. Absorbing layers may optionally have a gradient in composition over all or a portion of their thickness, so as to funnel or direct electrons and/or holes toward potential wells. In some embodiments of the present invention, the LED and the re-emitting semiconductor construction are provided in a single semiconductor unit. This semiconductor unit typically contains a first potential well located within a pn junction and a second potential well not located within a pn junction. The potential wells are typically quantum wells. The unit is capable of emitting light at two wavelengths, one corresponding to the transition energy of the first potential well and a second corresponding to the transition energy of the second potential well. In typical operation, the first potential well emits photons in response to an electric current passing through the pn junction and the second potential well emits photons in response to the absorption of a portion of the photons emitted from the first potential well. The semiconductor unit may additionally comprise one or more absorbing layers surrounding or closely or immediately adjacent to the second potential well. Absorbing layers typically have a band gap energy which is less than or equal to the transition energy of the first potential well and greater than that of the second potential well. In typical operation the absorbing layers assist absorption of photons emitted from the first potential well. The semiconductor unit may comprise additional potential wells, located within the pn junction or located not within the pn junction, and additional absorbing layers.

Figure 4:
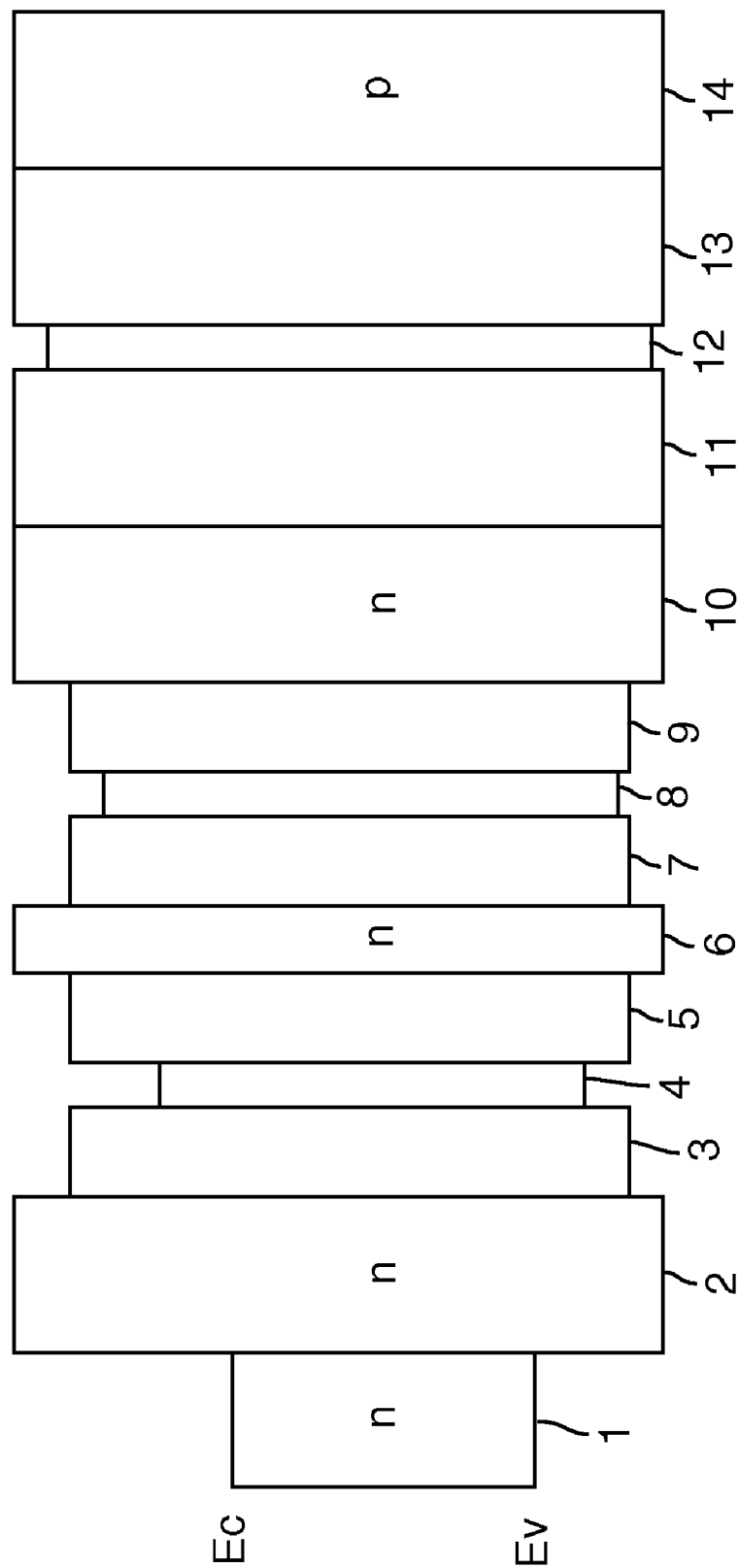
FIG. 4 is a flat-band diagram of conduction and valence bands of semiconductors in a construction according to one embodiment of the present invention. Layer thickness is not represented to scale.

FIG. 4 is a band diagram representing conduction and valence bands of semiconductors in such a semiconductor unit according to one embodiment of the present invention. Layer thickness is not represented to scale. Table II indicates the composition of layers 1-14 in this embodiment and the band gap energy ($E_g$) for that composition.

TABLE II

| Layer | Composition | Band gap Energy ($E_g$) |
|---|---|---|
| 1 | InP substrate | 1.35 eV |
| 2 | n-doped $Cd_{0.24}Mg_{0.43}Zn_{0.33}Se$ | 2.9 eV |
| 3 | $Cd_{0.35}Mg_{0.27}Zn_{0.38}Se$ | 2.6 eV |
| 4 | $Cd_{0.70}Zn_{0.30}Se$ | 1.9 eV |
| 5 | $Cd_{0.35}Mg_{0.27}Zn_{0.38}Se$ | 2.6 eV |
| 6 | n-doped $Cd_{0.24}Mg_{0.43}Zn_{0.33}Se$ | 2.9 eV |
| 7 | $Cd_{0.35}Mg_{0.27}Zn_{0.38}Se$ | 2.6 eV |
| 8 | $Cd_{0.33}Zn_{0.67}Se$ | 2.3 eV |
| 9 | $Cd_{0.35}Mg_{0.27}Zn_{0.38}Se$ | 2.6 eV |
| 10 | n-doped $Cd_{0.24}Mg_{0.43}Zn_{0.33}Se$ | 2.9 eV |
| 11 | undoped $Cd_{0.24}Mg_{0.43}Zn_{0.33}Se$ | 2.9 eV |
| 12 | $Cd_{0.31}Mg_{0.32}Zn_{0.37}Se$ | 2.7 eV |
| 13 | undoped $Cd_{0.24}Mg_{0.43}Zn_{0.33}Se$ | 2.9 eV |
| 14 | p-doped $Cd_{0.24}Mg_{0.43}Zn_{0.33}Se$ | 2.9 eV |

Layers 10, 11, 12, 13 and 14 represent a pn junction, or, more specifically, a pin junction, since intermediate undoped ("intrinsic" doping) layers 11, 12 and 13 are interposed between n-doped layer 10 and p-doped layer 14. Layer 12 represents a single potential well within the pn junction which is a quantum well having a thickness of about 10 nm. Alternately, the device may comprise multiple potential or quantum wells within the pn junction. Layers 4 and 8 represent second and third potential wells not within a pn junction, each being a quantum well having a thickness of about 10 nm. Alternately, the device may comprise additional potential or quantum wells not within the pn junction. In a further alternative, the device may comprise a single potential or quantum well not within the pn junction. Layers 3, 5, 7 and 9 represent absorbing layers, each having a thickness of about 1000 nm. Electrical contacts, not shown, provide a path for supply of electrical current to the pn junction. Electrical contacts conduct electricity and typically are composed of conductive metal. The positive electrical contact is electrically connected, either directly or indirectly through intermediate structures, to layer 14. The negative electrical contact is electrically connected, either directly or indirectly through intermediate structures, to one or more of layers 1, 2, 3, 4, 5, 6, 7, 8, 9 or 10.

Without wishing to be bound by theory, it is believed that this embodiment of the present invention operates according to the following principles: When an electrical current passes from layer 14 to layer 10, blue-wavelength photons are emitted from quantum well (12) in the pn junction. Photons traveling in the direction of layer 14 may leave the device. Photons traveling in the opposite direction may be absorbed and re-emitted from the second quantum well (8) as green-wavelength photons or from the third quantum well (4) as red-wavelength photons. The absorption of a blue-wavelength photon generates an electron-hole pair which may then recombine in the second or third quantum wells, with the emission of a photon. Green- or red-wavelength photons traveling in the direction of layer 14 may leave the device. The polychromatic combination of blue-, green- and red-wavelength light emitted from the device may appear white or near-white in color. The intensity of blue-, green- and red-wavelength light emitted from the device may be balanced in any suitable manner, including manipulation of the number of potential wells of each type and the use of filters or reflective layers. FIG. 3 represents a spectrum of light that emits from one embodiment of the device according to the present invention.

Again with reference to the embodiment represented by FIG. 4, absorbing layers 3, 5, 7 and 9 may be especially suitable to absorb photons emitted from the first quantum well (12), since they have a band gap energy that is intermediate between the transition energy of the first quantum well (12) and those of the second and third quantum wells (8 and 4). Electron-hole pairs generated by absorption of photons in the absorbing layers 3, 5, 7 and 9 are typically captured by the second or third quantum wells 8 and 4 before recombining with concomitant emission of a photon. Absorbing layers may optionally be doped, typically like to surrounding layers, which in this embodiment would be n-doping. Absorbing layers may optionally have a gradient in composition over all or a portion of their thickness, so as to funnel or direct electrons and/or holes toward potential wells.

Where the LED is a visible wavelength LED, the layers of the re-emitting semiconductor construction may be partially transparent to the light emitted from the LED. Alternately, such as where the LED is a UV wavelength LED, one or more of the layers of re-emitting semiconductor construction may block a greater portion or substantially or completely all of the light emitted from the LED, so that a greater portion or substantially or completely all of the light emitted from the device is light re-emitted from the re-emitting semiconductor construction. Where the LED is a UV wavelength LED, re-emitting semiconductor construction 10 may include red-, green- and blue-emitting quantum wells.

The device according to the present invention may comprise additional layers of conducting, semiconducting or non-conducting materials. Electrical contact layers may be added to provide a path for supply of electrical current to the LED. Light filtering layers may be added to alter or correct the balance of light wavelengths in the light emitted by the adapted LED.

In one embodiment, the device according to the present invention generates white or near-white light by emitting light at four principal wavelengths in the blue, green, yellow and red bands. In one embodiment, the device according to the present invention generates white or near-white light by emitting light at two principal wavelengths in the blue and yellow bands.

The device according to the present invention may comprise additional semiconductor elements comprising active or passive components such as resistors, diodes, zener diodes, capacitors, transistors, bipolar transistors, FET transistors, MOSFET transistors, insulated gate bipolar transistors, phototransistors, photodetectors, SCR's, thyristors, triacs, voltage regulators, and other circuit elements. The device according to the present invention may comprise an integrated circuit. The device according to the present invention may comprise a display panel or an illumination panel.

The LED and the re-emitting semiconductor construction which make up the device according to the present invention may be manufactured by any suitable method, which may include molecular beam epitaxy (MBE), chemical vapor deposition, liquid phase epitaxy and vapor phase epitaxy. The elements of the device according to the present invention may include a substrate. Any suitable substrate may be used in the practice of the present invention. Typical substrate materials include Si, Ge, GaAs, InP, sapphire, SiC and ZnSe. The substrate may be n-doped, p-doped, or semi-insulating, which may be achieved by any suitable method or by inclusion of any suitable dopant. Alternately, the elements of the device according to the present invention may be without a substrate. In one embodiment, elements of the device according to the present invention may be formed on a substrate and then separated from the substrate. The elements of the device according to the present invention may be joined together by any suitable method, including the use of adhesive or welding materials, pressure, heat or combinations thereof. Typically, the bond created is transparent. Bonding methods may include interfacial or edge bonding. Optionally, refractive index matching layers or interstitial spaces may be included.

LED's are typically sold in a packaged form that includes an LED die or chip mounted on a metal header. An LED die is an LED in its most basic form, i.e., in the form of an individual component or chip made by semiconductor wafer processing procedures. The component or chip can include electrical contacts suitable for application of power to energize the device. The individual layers and other functional elements of the component or chip are typically formed on the wafer scale, the finished wafer finally being diced into individual piece parts to yield a multiplicity of LED dies. The metal header has a reflective cup in which the LED die is mounted, and electrical leads connected to the LED die. The package further includes a molded transparent resin that encapsulates the LED die. The encapsulating resin typically has a nominally hemispherical front surface to partially collimate light emitted from the LED die. An LED component can be or comprise an LED die or an LED die in combination with a re-emitting semiconductor construction or other elements.

Converging optical elements useful in the practice of the present disclosure are useful in efficiently extracting light out of LED components and modifying the angular distribution of the emitted light. The LED component of such packages may be an LED/ re-emitting semiconductor construction combination, either as separate elements or as a semiconductor unit, as described above or in currently pending U.S. patent applications U.S. Ser. No. 11/009,217 or U.S. Ser. No. 11/009,241, incorporated herein by reference.

The present application discloses light sources having optical elements for efficiently extracting light out of LED components and for modifying the angular distribution of the emitted light. Each optical element is optically coupled to the emitting surface an LED component (or LED component array) to efficiently extract light and to modify the emission pattern of the emitted light. LED sources that include optical elements can be useful in a variety of applications, including, for example, backlights in liquid crystal displays or backlit signs.

Light sources comprising converging optical elements described herein can be suited for use in backlights, both edge-lit and direct-lit constructions. Wedge-shaped optical elements are particularly suited for edge-lit backlights, where the light source is disposed along an outer portion of the backlight. Pyramid or cone-shaped converging optical elements can be particularly suited for use in direct-lit backlights. Such light sources can be used as single light source elements, or can be arranged in an array, depending on the particular backlight design.

For a direct-lit backlight, the light sources are generally disposed between a diffuse or specular reflector and an upper film stack that can include prism films, diffusers, and reflective polarizers. These can be used to direct the light emitted from the light source towards the viewer with the most useful range of viewing angles and with uniform brightness. Exemplary prism films include brightness enhancement films such as BEF™ available from 3M Company, St. Paul, Minn. Exemplary reflective polarizers include DBEF™ also available from 3M Company, St. Paul, Minn. For an edge-lit backlight, the light source can be positioned to inject light into a hollow or solid light guide. The light guide generally has a reflector below it and an upper film stack as described above.

FIG. 5 is a schematic side view illustrating a light source according to one embodiment. The light source comprises an optical element 20 and an LED component 10. The optical element 20 has a triangular cross-section with a base 120 and two converging sides 140 joined opposite the base 120 to form an apex 130. The apex can be a point, as shown at 130 in FIG. 5, or can be blunted, as for example in a truncated triangle (shown by dotted line 135). A blunted apex can be flat, rounded, or a combination thereof The apex is smaller than the base and preferably resides over the base. In some embodiments, the apex is no more than 20% of the size of the base. Preferably, the apex is no more than 10% of the size of the base. In FIG. 5, the apex 130 is centered over the base 120. However, embodiments where the apex is not centered or is skewed away from the center of the base are also contemplated.

The optical element 20 is optically coupled to the LED component 10 to extract light emitted by the LED component 10. The primary emitting surface 100 of the LED component 10 is substantially parallel and in close proximity to the base 120 of the optical element 20. The LED component 10 and optical element 20 can be optically coupled in a number of ways including bonded and non-bonded configurations, which are described in more detail below.

The converging sides 140*a-b* of the optical element 20 act to modify the emission pattern of light emitted by the LED component 10, as shown by the arrows 160*a-b* in FIG. 5. A typical bare LED component emits light in a first emission pattern. Typically, the first emission pattern is generally forward emitting or has a substantial forward emitting component. A converging optical element, such as optical element 20 depicted in FIG. 5, modifies the first emission pattern into a second, different emission pattern. For example, a wedge-shaped optical element directs light emitted by the LED component to produce a side emitting pattern having two lobes. FIG. 5 shows exemplary light rays 160*a-b* emitted by the LED component entering the optical element 20 at the base. A light ray emitted in a direction forming a relatively low incidence angle with the converging side 140*a* will be refracted as it exits the high index material of the optical element 20 into the surrounding medium (e.g. air). Exemplary light ray 160*a* shows one such light ray, incident at a small angle with respect to normal. A different light ray, emitted at a high incidence angle, an angle greater than or equal to the critical angle, will be totally internally reflected at the first converging side it encounters (140*a*). However, in a converging optical element such as the one illustrated in FIG. 5, the reflected ray will subsequently encounter the second converging side (140*b*) at a low incidence angle, where it will be refracted and allowed to exit the optical element. An exemplary light ray 160*b* illustrates one such light path.

An optical element having at least one converging side can modify a first light emission pattern into a second, different light emission pattern. For example, a generally forward emitting light pattern can be modified into a second, generally side-emitting light pattern with such a converging optical element. In other words, a high index optical element can be shaped to direct light emitted by the LED component to produce a side emitting pattern. If the optical element is rotationally symmetric (e.g. shaped as a cone) the resulting light emission pattern will have a torroidal distribution—the intensity of the emitted light will be concentrated in a circular pattern around the optical element. If, for example, an optical element is shaped as a wedge (e.g. see FIG. 7) the side emitting pattern will have two lobes—the light intensity will be concentrated in two zones. In case of a symmetric wedge, the two lobes will be located on opposing sides of the optical element (two opposing zones). For optical elements having a plurality of converging sides, the side emitting pattern will have a corresponding plurality of lobes. For example, for an optical element shaped as a four-sided pyramid, the resulting side emitting pattern will have four lobes. The side emitting pattern can be symmetric or asymmetric. An asymmetric pattern will be produced when the apex of the optical element is placed asymmetrically with respect to the base or emission surface. Those skilled in the art will appreciate the various permutations of such arrangements and shapes to produce a variety of different emission patterns, as desired.

In some embodiments, the side emitting pattern has an intensity distribution with a maximum at a polar angle of at least 30°, as measured in an intensity line plot. In other embodiments the side emitting pattern has an intensity distribution centered at a polar angle of at least 30°. Other intensity distributions are also possible with presently disclosed optical elements, including, for example those having maxima and/or centered at 45° and 60° polar angle.

Converging optical elements can have a variety of forms. Each optical element has a base, an apex, and at least one converging side. The base can have any shape (e.g. square, circular, symmetrical or non-symmetrical, regular or irregular). The apex can be a point, a line, or a surface (in case of a blunted apex). Regardless of the particular converging shape, the apex is smaller in surface area than the base, so that the side(s) converge from the base towards the apex. A converging optical element can be shaped as a pyramid, a cone, a wedge, or a combination thereof. Each of these shapes can also be truncated near the apex, forming a blunted apex. A converging optical element can have a polyhedral shape, with a polygonal base and at least two converging sides. For example, a pyramid or wedge-shaped optical element can have a rectangular or square base and four sides wherein at least two of the sides are converging sides. The other sides can be parallel sides, or alternatively can be diverging or converging. The shape of the base need not be symmetrical and can be shaped, for example, as a trapezoid, parallelogram, quadrilateral, or other polygon. In other embodiments, a converging optical element can have a circular, elliptical, or an irregularly-shaped but continuous base. In these embodiments, the optical element can be said to have a single converging side. For example, an optical element having a circular base can be shaped as a cone. Generally, a converging optical element comprises a base, an apex residing (at least partially) over the base, and one or more converging sides joining the apex and the base to complete the solid.

FIG. 6*a* shows one embodiment of a converging optical element 200 shaped as a four-sided pyramid having a base 220, an apex 230, and four sides 240. In this particular embodiment, the base 220 can be rectangular or square and the apex 230 is centered over the base (a projection of the apex in a line 210 perpendicular to the plane of the base is centered over the base 220). FIG. 6*a* also shows an LED component 10 having an emitting surface 100 which is proximate and parallel to the base 220 of the optical element 200. The LED component 10 and optical element 200 are optically coupled at the emitting surface—base interface. Optical coupling can be achieved in several ways, described in more detail below. For example, the LED component and optical element can be bonded together. In FIG. 6*a* the base and the emitting surface of the LED component are shown as substantially matched in size. In other embodiments, the base can be larger or smaller than the LED component emitting surface.

FIG. 6*b* shows another embodiment of a converging optical element 202. Here, optical element 202 has a hexagonal base 222, a blunted apex 232, and six sides 242. The sides extend between the base and the apex and each side converges towards the apex 232. The apex 232 is blunted and forms a surface also shaped as a hexagon, but smaller than the hexagonal base.

FIG. 6c shows another embodiment of an optical element 204 having two converging sides 244, a base 224, and an apex 234. In FIG. 6c, the optical element is shaped as a wedge and the apex 234 forms a line. The other two sides are shown as parallel sides. Viewed from the top, the optical element 204 is depicted in FIG. 8d.

Figure 7:
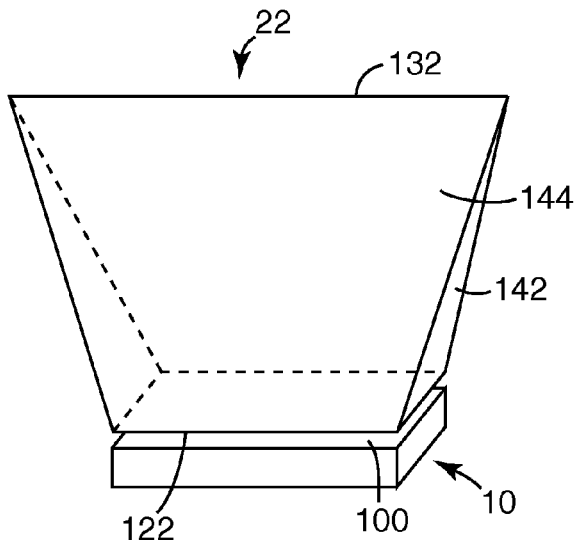
FIG. 7 is a perspective view of an optical element according to another embodiment.

Alternative embodiments of wedge-shaped optical elements also include shapes having a combination of converging and diverging sides, such as the optical element 22 shown in FIG. 7. In the embodiment shown in FIG. 7, the wedge-shaped optical element 22 resembles an axe-head. The two diverging sides 142 act to collimate the light emitted by the LED component. The two converging sides 144 converge at the top forming an apex 132 shaped as a line residing over the base when viewed from the side (see FIG. 5), but having portions extending beyond the base when viewed as shown in FIG. 7 (or FIG. 8e). The converging sides 144 allow the light emitted by the LED component 10 to be redirected to the sides, as shown in FIG. 5. Other embodiments include wedge shapes where all sides converge, for example as shown in FIG. 8f.

The optical element can also be shaped as a cone having a circular or elliptical base, an apex residing (at least partially) over the base, and a single converging side joining the base and the apex. As in the pyramid and wedge shapes described above, the apex can be a point, a line (straight or curved) or it can be blunted forming a surface.

Figure 8A:
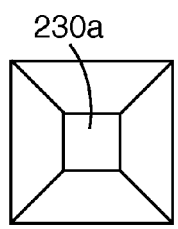
FIGS. 8*a-i* are top views of optical elements according to several alternative embodiments.
Figure 8B:
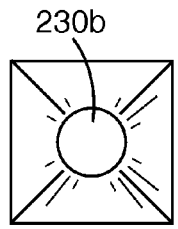
Figure 8C:
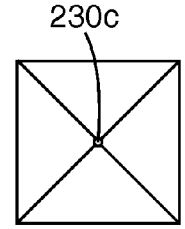
Figure 8D:
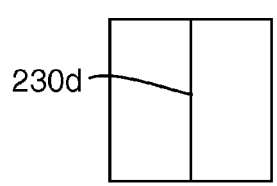
Figure 8E:
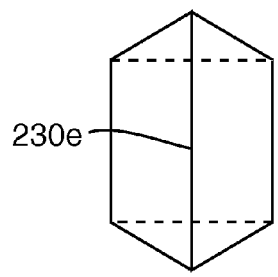
Figure 8F:
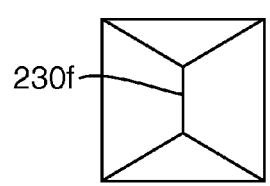
Figure 8G:
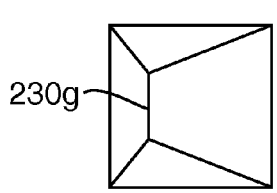
Figure 8H:
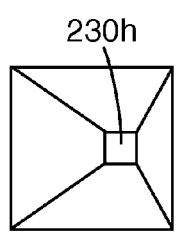
Figure 8I:
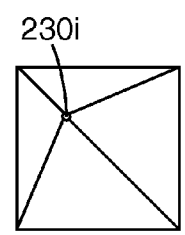

FIGS. 8a-8i show top views of several alternative embodiments of an optical element. FIGS. 8a-8f show embodiments in which the apex is centered over the base. FIGS. 8g-8i show embodiments of asymmetrical optical elements in which the apex is skewed or tilted and is not centered over the base.

FIG. 8a shows a pyramid-shaped optical element having a square base, four sides, and a blunted apex 230a centered over the base. FIG. 8h shows a pyramid-shaped optical element having a square base, four sides, and a blunted apex 230h that is off-center. FIG. 8b shows an embodiment of an optical element having a square base and a blunted apex 230b shaped as a circle. In this case, the converging sides are curved such that the square base is joined with the circular apex. FIG. 8c shows a pyramid-shaped optical element having a square base, four triangular sides converging at a point to form an apex 230c, which is centered over the base. FIG. 8i shows a pyramid-shaped optical element having a square base, four triangular sides converging at a point to form an apex 230i, which is skewed (not centered) over the base.

FIGS. 8d-8g show wedge-shaped optical elements. In FIG. 8d, the apex 230d forms a line residing and centered over the base. In FIG. 8e, the apex 230e forms a line that is centered over the base and partially resides over the base. The apex 230e also has portions extending beyond the base. The top view depicted in FIG. 8e can be a top view of the optical element shown perspective in FIG. 7 and described above. FIG. 8f and FIG. 8g show two alternative embodiments of a wedge-shaped optical element having an apex forming a line and four converging sides. In FIG. 8f, the apex 230f is centered over the base, while in FIG. 8g, the apex 230g is skewed.

Figure 9A:
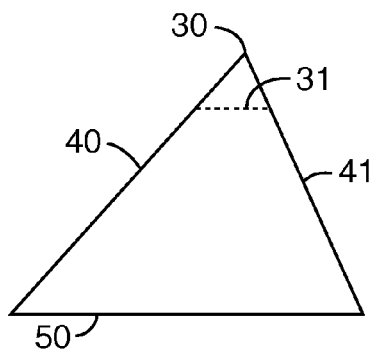
FIGS. 9*a-c* are schematic front views illustrating optical elements in alternative embodiments.
Figure 9B:
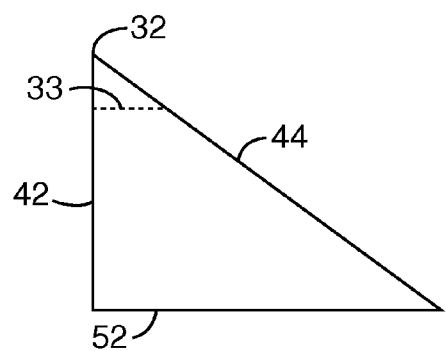
Figure 9C:
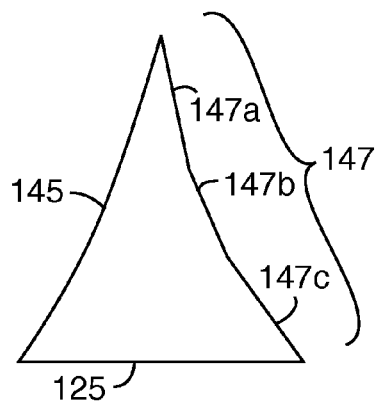

FIGS. 9a-9c show side views of an optical element according to alternative embodiments. FIG. 9a shows one embodiment of an optical element having a base 50 and sides 40 and 41 starting at the base 50 and converging towards an apex 30 residing over the base 50. Optionally, the sides can converge toward a blunted apex 31. FIG. 9b shows another embodiment of an optical element having a base 52, a converging side 44 and a side 42 perpendicular to the base. The two sides 42 and 44 form an apex 32 residing over the edge of the base. Optionally, the apex can be a blunted apex 33. FIG. 9c shows a side view of an alternative optical element having a generally triangular cross section. Here, the base 125 and the sides 145 and 147 generally form a triangle, but the sides 145 and 147 are non-planar surfaces. In FIG. 9c the optical element has a left side 145 that is curved and a right side that is faceted (i.e. it is a combination of three smaller flat portions 147a-c). The sides can be curved, segmented, faceted, convex, concave, or a combination thereof. Such forms of the sides still function to modify the angular emission of the light extracted similarly to the planar or flat sides described above, but offer an added degree of customization of the final light emission pattern.

Figure 10A:
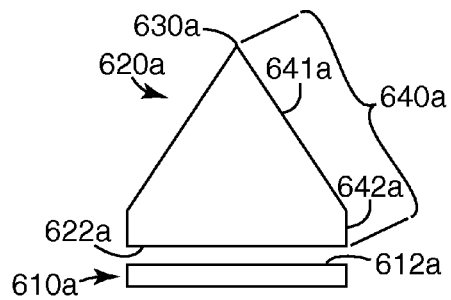
FIGS. 10*a-e* are schematic side views of optical elements and LED components according to several alternative embodiments.
Figure 10B:
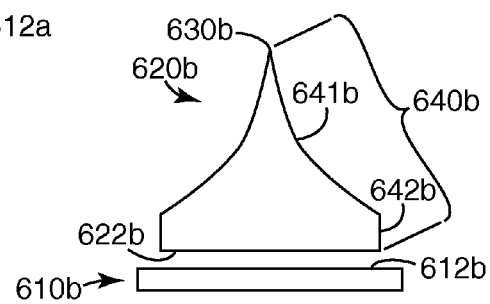
Figure 10C:
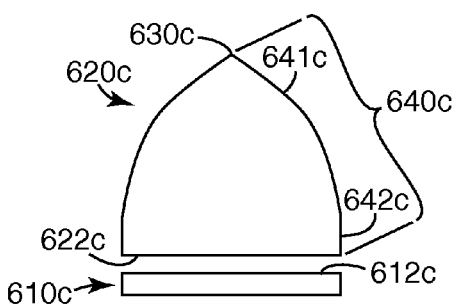
Figure 10D:
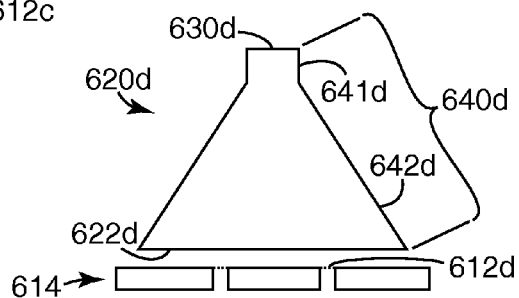
Figure 10E:
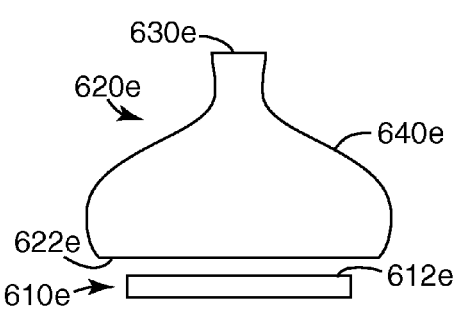

FIGS. 10a-10e depict alternative embodiments of optical elements 620a-e having non-planar sides 640a-e extending between each base 622a-e and apex 630a-e, respectively. In FIG. 10a, the optical element 620a has sides 640a comprising two faceted portions 641a and 642a. The portion 642a near the base 622a is perpendicular to the base 622a while the portion 641a converges toward the apex 630a. Similarly, in FIGS. 10b-c, the optical elements 620b-c have sides 640b-c formed by joining two portions 641b-c and 642b-c, respectively. In FIG. 10b, the converging portion 641b is concave. In FIG. 10c, the converging portion 641c is convex. FIG. 10d shows an optical element 620d having two sides 640d formed by joining portions 641d and 642d. Here, the portion 642d near the base 622d converges toward the blunted apex 630d and the top-most portion 641d is perpendicular to the surface of the blunted apex 630d. FIG. 10e shows an alternative embodiment of an optical element 620e having curved sides 640e. Here, the sides 640e are s-shaped, but generally converge towards the blunted apex 630e. When the sides are formed of two or more portions, as in FIGS. 10a-e, preferably the portions are arranged so that the side is still generally converging, even though it may have portions which are non-converging.

Figure 11A:
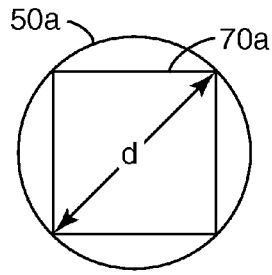
FIGS. 11*a-d* are bottom views of optical elements and LED components according to several embodiments.
Figure 11B:
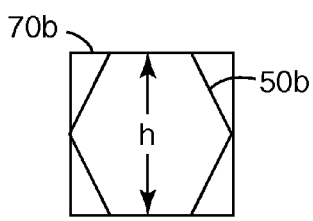
Figure 11C:
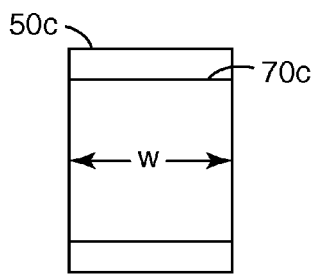
Figure 11D:
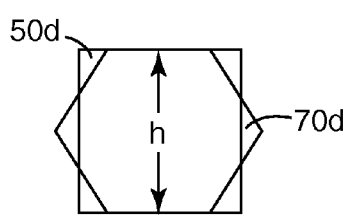

Preferably, the size of the base is matched to the size of the LED component at the emitting surface. FIGS. 11a-11d show exemplary embodiments of such arrangements. In FIG. 11a an optical element having a circular base 50a is optically coupled to an LED component having a square emitting surface 70a. Here, the base and emitting surface are matched by having the diameter "d" of the circular base 50a equal to the diagonal dimension (also "d") of the square emitting surface 70a. In FIG. 11b, an optical element having a hexagonal base 50b is optically coupled to an LED component having a square emitting surface 70b. Here, the height "h" of the hexagonal base 50b matches the height "h" of the square emitting surface 70b. In FIG. 11c, an optical element having a rectangular base 50c is optically coupled to an LED component having a square emitting surface 70c. Here, the width "w" of both the base and the emitting surface are matched. In FIG. 11d, an optical element having a square base 50d is optically coupled to an LED component having a hexagonal emitting surface 70d. Here, the height "h" of both the base and the emitting surface are matched. Of course, a simple arrangement, in which both the base and emitting surface are identically shaped and have the same surface area, also meets this criteria. Here, the surface area of the base is matched to the surface area of the emitting surface of the LED component.

Similarly, when an optical element is coupled to an array of LED components, the size of the array at the emitting surface side preferably can be matched to the size of the base of the optical element. Again, the shape of the array need not match the shape of the base, as long as they are matched in at least one dimension (e.g. diameter, width, height, or surface area).

Alternatively, the size of the LED component at the emitting surface or the combined size of the LED component array can be smaller or larger than the size of the base. FIGS. 10a and 10c show embodiments in which the emitting surface (612a and 612c, respectively) of the LED component (610a and 610c, respectively) is matched to the size of the base (622a and 622c, respectively). FIG. 10b shows an LED component 610b having an emitting surface 612b that is larger than the base 622b. FIG. 10d shows an array 612d of LED components, the array having a combined size at the emitting surface 612d that is larger than the size of the base 622d. FIG. 10e shows an LED component 610e having an emitting surface 612e that is smaller than the base 622e.

For example, if the LED component emitting surface is a square having sides of 1 mm, the optical element base can be made having a matching square having a 1 mm side. Alternatively, a square emitting surface could be optically coupled to a rectangular base, the rectangle having one of its sides matched in size to the size of the emitting surface side. The non-matched side of the rectangle can be larger or smaller than the side of the square. Optionally, an optical element can be made having a circular base having a diameter equal to the diagonal dimension of the emitting surface. For example, for a 1 mm by 1 mm square emitting surface a circular base having a diameter of 1.41 mm would be considered matched in size for the purpose of this application. The size of the base can also be made slightly smaller than the size of the emitting surface. This can have advantages if one of the goals is to minimize the apparent size of the light source, as described in commonly owned U.S. patent application Ser. No. 10/977,577 titled "High Brightness LED Package".

Figure 12:
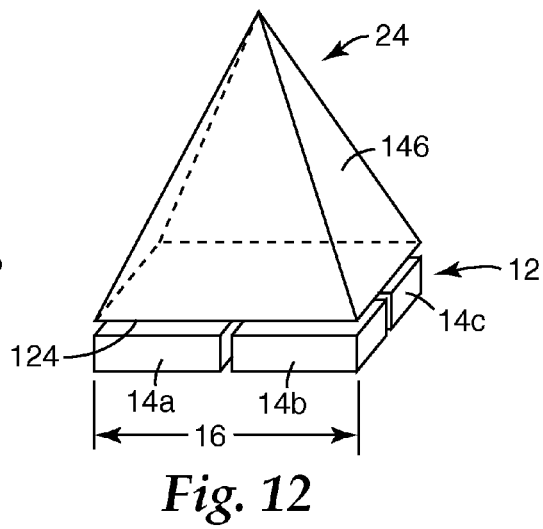
FIG. 12 is a perspective view of an optical element and an LED component array according to another embodiment.

FIG. 12 shows another embodiment of a light source comprising a converging optical element 24 optically coupled to a plurality of LED components 14a-c arranged in an array 12. This arrangement can be particularly useful when red, green, and blue LEDs are combined in the array to produce white light when mixed. In FIG. 12, the optical element 24 has converging sides 146 to redirect light to the sides. The optical element 24 has a base 124 shaped as a square, which is optically coupled to the array of LED components 12. The array of LED components 12 also forms a square shape (having sides 16).

Optical elements disclosed herein can be manufactured by conventional means or by using precision abrasive techniques disclosed in commonly assigned U.S. patent application Ser. No. 10/977,239, titled "PROCESS FOR MANUFACTURING OPTICAL AND SEMICONDUCTOR ELEMENTS", U.S. patent application Ser. No. 10/977,240, titled "PROCESS FOR MANUFACTURING A LIGHT EMITTING ARRAY", and U.S. patent application Ser. No. 11/288,071, titled "ARRAYS OF OPTICAL ELEMENTS AND METHOD OF MANUFACTURING SAME".

The optical element is transparent and preferably has a relatively high refractive index. Suitable materials for the optical element include without limitation inorganic materials such as high index glasses (e.g. Schott glass type LASF35, available from Schott North America, Inc., Elmsford, N.Y. under a trade name LASF35) and ceramics (e.g. sapphire, zinc oxide, zirconia, diamond, and silicon carbide). Sapphire, zinc oxide, diamond, and silicon carbide are particularly useful since these materials also have a relatively high thermal conductivity (0.2-5.0 W/cm K). High index polymers or nanoparticle filled polymers are also contemplated. Suitable polymers can be both thermoplastic and thermosetting polymers. Thermoplastic polymers can include polycarbonate and cyclic olefin copolymer. Thermosetting polymers can be for example acrylics, epoxy, silicones and others known in the art. Suitable ceramic nanoparticles include zirconia, titania, zinc oxide, and zinc sulfide.

The index of refraction of the optical element ($n_o$) is preferably similar to the index of LED component emitting surface ($n_e$). Preferably, the difference between the two is no greater than 0.2 ($|n_o-n_e|\leq 0.2$). Optionally, the difference can be greater than 0.2, depending on the materials used. For example, the emitting surface can have an index of refraction of 1.75. A suitable optical element can have an index of refraction equal to or greater than 1.75 ($n_o\geq 1.75$), including for example $n_o\geq 1.9$, $n_o\geq 2.1$, and $n_o\geq 2.3$. Optionally, $n_o$ can be lower than $n_e$ (e.g. $n_o\geq 1.7$). Preferably, the index of refraction of the optical element is matched to the index of refraction of the primary emitting surface. In some embodiments, the indexes of refraction of both the optical element and the emitting surface can be the same in value ($n_o=n_e$). For example, a sapphire emitting surface having $n_e=1.76$ can be matched with a sapphire optical element, or a glass optical element of SF4 (available from Schott North America, Inc., Elmsford, N.Y. under a trade name SF4) $n_o=1.76$. In other embodiments, the index of refraction of the optical element can be higher or lower than the index of refraction of the emitting surface. When made of high index materials, optical elements increase light extraction from the LED component due to their high refractive index and modify the emission distribution of light due to their shape, thus providing a tailored light emission pattern.

Throughout this disclosure, the LED component 10 is depicted generically for simplicity, but can include conventional design features as known in the art in addition to the re-emitting structures described above. For example, the LED component can include distinct p- and n-doped semiconductor layers, buffer layers, substrate layers, and superstrate layers. A simple rectangular LED component arrangement is shown, but other known configurations are also contemplated, e.g., angled side surfaces forming a truncated inverted pyramid LED component shape. Electrical contacts to the LED component are also not shown for simplicity, but can be provided on any of the surfaces of the die as is known. In exemplary embodiments the LED component has two contacts both disposed at the bottom surface in a "flip chip" design. The present disclosure is not intended to limit the shape of the optical element or the shape of the LED component, but merely provides illustrative examples.

An optical element is considered optically coupled to an LED component, when the minimum gap between the optical element and emitting surface of the LED component is no greater than the evanescent wave. Optical coupling can be achieved by placing the LED component and the optical element physically close together. FIG. 5 shows a gap 150 between the emitting surface 100 of the LED component 10 and the base 120 of optical element 20. Typically, the gap 150 is an air gap and is typically very small to promote frustrated total internal reflection. For example, in FIG. 5, the base 120 of the optical element 20 is optically close to the emitting surface 100 of the LED component 10, if the gap 150 is on the order of the wavelength of light in air. Preferably, the thickness of the gap 150 is less than a wavelength of light in air. In LEDs where multiple wavelengths of light are used, the gap 150 is preferably at most the value of the longest wavelength. Suitable gap sizes include 25 nm, 50 nm, and 100 nm. Preferably, the gap is minimized, such as when the LED component and the input aperture or base of the optical element are polished to optical flatness and wafer bonded together.

In addition, it is preferred that the gap 150 be substantially uniform over the area of contact between the emitting surface 100 and the base 120, and that the emitting surface 100 and the base 120 have a roughness of less than 20 nm, preferably less than 5 nm. In such configurations, a light ray emitted from LED component 10 outside the escape cone or at an angle that would normally be totally internally reflected at the LED component-air interface will instead be transmitted into the optical element 20. To promote optical coupling, the surface of the base 120 can be shaped to match the emitting surface 100. For example, if the emitting surface 100 of LED component 10 is flat, as shown in FIG. 5, the base 120 of optical element 20 can also be flat. Alternatively, if the emitting surface of the LED component is curved (e.g. slightly concave) the base of the optical element can be shaped to mate with the emitting surface (e.g. slightly convex). The size of the base 120 may either be smaller, equal, or larger than LED component emitting surface 100. The base 120 can be the same or different in cross sectional shape than LED component 10. For example, the LED component can have a square emitting surface while the optical element has a circular base. Other variations will be apparent to those skilled in the art.

Suitable gap sizes include 100 nm, 50 nm, and 25 nm. Preferably, the gap is minimized, such as when the LED component and the input aperture or base of the optical element are polished to optical flatness and wafer bonded together. The optical element and LED component can be bonded together by applying high temperature and pressure to provide an optically coupled arrangement. Any known wafer bonding technique can be used. Exemplary wafer bonding techniques are described in U.S. patent application Ser. No. 10/977,239, titled "Process for Manufacturing Optical and Semiconductor Elements".

Figure 13:
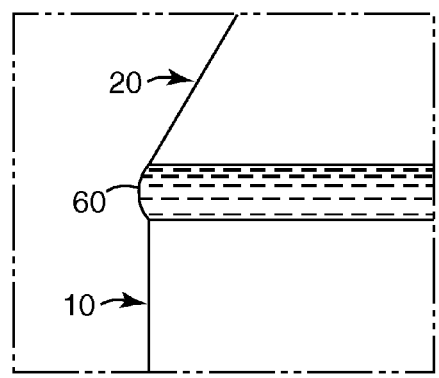
FIG. 13 is partial view of an optical element and an LED component according to another embodiment.

In case of a finite gap, optical coupling can be achieved or enhanced by adding a thin optically conducting layer between the emitting surface of the LED component and the base of the optical element. FIG. 13 shows a partial schematic side view of an optical element and LED component, such as that shown in FIG. 5, but with a thin optically conducting layer 60 disposed within the gap 150. Like the gap 150, the optically conducting layer 60 can be 100 nm, 50 nm, 25 nm in thickness or less. Preferably, the refractive index of the optically coupling layer is closely matched to the refractive index of the emission surface or the optical element. An optically conducting layer can be used in both bonded and non-bonded (mechanically decoupled) configurations. In bonded embodiments, the optically conducting layer can be any suitable bonding agent that transmits light, including, for example, a transparent adhesive layer, inorganic thin films, fusable glass frit or other similar bonding agents. Additional examples of bonded configurations are described, for example, in U.S. Patent Publication No. U.S. 2002/0030194 titled "Light Emitting Diodes with Improved Light Extraction Efficiency" (Camras et al.) published on Mar. 14, 2002.

In non-bonded embodiments, an LED component can be optically coupled to the optical element without use of any adhesives or other bonding agents between the LED component and the optical element. Non-bonded embodiments allow both the LED component and the optical element to be mechanically decoupled and allowed to move independently of each other. For example, the optical element can move laterally with respect to the LED component. In another example both the optical element and the LED component are free to expand as each component becomes heated during operation. In such mechanically decoupled systems the majority of stress forces, either sheer or normal, generated by expansion are not transmitted from one component to another component. In other words, movement of one component does not mechanically affect other components. This configuration can be particularly desirable where the light emitting material is fragile, where there is a coefficient of expansion mismatch between the LED component and the optical element, and where the LED is being repeatedly turned on and off.

Mechanically decoupled configurations can be made by placing the optical element optically close to the LED component (with only a very small air gap between the two). The air gap should be small enough to promote frustrated total internal reflection, as described above.

Alternatively, as shown in FIG. 13, a thin optically conducting layer 60 (e.g. an index matching fluid) can be added in the gap 150 between the optical element 20 and the LED component 10, provided that the optically conducting layer allows the optical element and LED component to move independently. Examples of materials suitable for the optically conducting layer 60 include index matching oils, and other liquids or gels with similar optical properties. Optionally, optically conducting layer 60 can also be thermally conducting.

The optical element and LED component can be encapsulated together using any of the known encapsulant materials, to make a final LED package or light source. Encapsulating the optical element and LED component provides a way to hold them together in the non-bonded embodiments.

Additional non-bonded configurations are described in commonly owned U.S. patent application Ser. No. 10/977, 249, titled "LED Package with Non-bonded Optical Element".

The optical element can be made from a single structure, for example cut from a single block of material, or can be made by joining two or more sections together in a compound construction.

A first section desirably makes optical contact with the LED component, and is made of a first optical material having a high refractive index (preferably about equal to the LED component refractive index at the emitting surface), and optionally high thermal conductivity, and/or high thermal stability. In this regard, high thermal stability refers to materials having a decomposition temperature of about 600° C. or more. The thickness of the first section is preferably optically thick (e.g. effectively at least 5 microns, or 10 times the wavelength of light).

Silicon carbide is also electrically conductive, and as such may also provide an electrical contact or circuit function. Scattering within optical elements may be acceptable if the scattering is limited to a position near the input end or base of the optical element. However, it would be expensive and time consuming to make an optical element with sufficient length to efficiently couple light from an LED component. An additional challenge in making one-piece optical elements is that the material yield may be relatively low, and the form-factor may force the LED component to be individually assembled with the optical element. For these reasons, it can be advantageous to divide the optical element into two (or more) sections, the sections being made of different optical materials, to reduce manufacturing cost.

A second section is joined to the first section and is made of a second optical material, which may have lower material costs and be more easily fabricated than the first optical material. The second optical material may have a lower refractive index, lower thermal conductivity, or both relative to the first optical material. For example, the second optical material can comprise glasses, polymers, ceramics, ceramic nanoparticle-filled polymers, and other optically clear materials. Suitable glasses include those comprising oxides of lead, zirconium, titanium, and barium. The glasses can be made from compounds including titanates, zirconates, and stannates. Suitable ceramic nanoparticles include zirconia, titania, zinc oxide, and zinc sulfide.

Optionally, a third section composed of a third optical material can be joined to the second section to further aid in coupling the LED light to the outside environment. In one embodiment the refractive indices of the three sections are arranged such that $n_1 > n_2 > n_3$ to minimize overall Fresnel surface reflections associated with the optical element.

The light source according to the present invention may be a component or the critical component of a graphic display device such as a large- or small-screen video monitor, computer monitor or display, television, telephone device or telephone device display, personal digital assistant or personal digital assistant display, pager or pager display, calculator or calculator display, game or game display, toy or toy display, large or small appliance or large or small appliance display, automotive dashboard or automotive dashboard display, automotive interior or automotive interior display, marine dashboard or marine dashboard display, marine interior or marine interior display, aeronautic dashboard or aeronautic dashboard display, aeronautic interior or aeronautic interior display, traffic control device or traffic control device display, advertising display, advertising sign, or the like.

The light source according to the present invention may be a component or the critical component of a liquid crystal display (LCD), or like display, as a backlight to that display. In one embodiment, the semiconductor device according to the present invention is specially adapted for use a backlight for a liquid crystal display by matching the colors emitted by the semiconductor device according to the present invention to the color filters of the LCD display.

The light source according to the present invention may be a component or the critical component of an illumination device such as a free-standing or built-in lighting fixture or lamp, landscape or architectural illumination fixture, hand-held or vehicle-mounted lamp, automotive headlight or tail-light, automotive interior illumination fixture, automotive or non-automotive signaling device, road illumination device, traffic control signaling device, marine lamp or signaling device or interior illumination fixture, aeronautic lamp or signaling device or interior illumination fixture, large or small appliance or large or small appliance lamp, or the like; or any device or component used as a source of infrared, visible, or ultraviolet radiation.

Various modifications and alterations of this invention will become apparent to those skilled in the art without departing from the scope and principles of this invention, and it should be understood that this invention is not to be unduly limited to the illustrative embodiments set forth hereinabove.

I claim:

1. A light source, comprising:
   a) an LED component comprising a first potential well located within a pn junction and a second potential well not located within a pn junction, the component having an emitting surface; and
   b) an optical element including a base, an apTex, and a side joining the base and the apex, wherein the base is optically coupled to and mechanically decoupled from the emitting surface.

2. A graphic display device comprising the light source according to claim 1.

3. An illumination device comprising the light source according to claim 1.

4. A light source:
   a) an LED component comprising a first potential well located within a pn junction and a second potential well not located within a pn junction, the component having an emitting surface; and
   b) an optical element having a base, two converging sides, and two diverging sides, wherein the base is optically coupled to the emitting surface.

5. A light source, comprising:
   a) an LED component comprising a first potential well located within a pn junction and a second potential well not located within a pn junction, the component having an emitting surface; and
   b) a high index optical element optically coupled to the LED component and shaped to direct light emitted by the LED component to produce a side emitting pattern having two lobes.

6. A light source, comprising:
   a) an LED component comprising a first potential well located within a pn junction and a second potential well not located within a pn junction, the component having an emitting surface; and
   b) an optical element including a base, an apex smaller than the base, and a converging side extending between the base and the apex, wherein the base is optically coupled to and is no greater in size than the emitting surface; wherein the optical element directs light emitted by the LED component to produce a side emitting pattern.

7. A light source, comprising:
   a) an LED component comprising a first potential well located within a pn junction and a second potential well not located within a pn junction, the component having an emitting surface; and
   b) an optical element including a base, an apex, and a converging side joining the base and the apex, wherein the base is optically coupled to the emitting surface; wherein the optical element comprises a first section including the base and that is composed of a first material; and wherein the optical element comprises a second section including the apex and that is composed of a second material.

8. A light source, comprising:
   a) an LED component comprising a first potential well located within a pn junction and a second potential well not located within a pn junction, the component having an emitting surface; and
   b) a first optical element including a base, an apex, and a converging side joining the base and the apex, wherein the base is optically coupled to and is no greater in size than the emitting surface, the first optical element having a first index of refraction; and
   c) a second optical element encapsulating the LED component and the first optical element, the second optical element having a second index of refraction lower than the first index of refraction.

9. A light source, comprising:
   a) an LED component comprising a first potential well located within a pn junction and a second potential well not located within a pn junction, the component having an emitting surface; and
   b) a first optical element including a base, an apex residing over the emitting surface, and a converging side joining the base and the apex, wherein the base is optically coupled to the emitting surface, the first optical element having a first index of refraction; and
   c) a second optical element encapsulating the LED component and the first optical element, the second optical element having a second index of refraction lower than the first index of refraction.

10. A light source, comprising:
    a) an LED component comprising a first potential well located within a pn junction and a second potential well not located within a pn junction, the component having an emitting surface; and b) a first optical element including a base, an apex, and a converging side joining the base and the apex, wherein the base is optically coupled to the emitting surface; and c) a second optical element encapsulating the LED component and the first optical element, the second optical element providing an increase in power extracted from the LED component as compared to the power extracted by first optical element alone.

* * * * *

UNITED STATES PATENT AND TRADEMARK OFFICE
CERTIFICATE OF CORRECTION

PATENT NO. : 7,541,610 B2  Page 1 of 1
APPLICATION NO. : 11/761067
DATED : June 2, 2009
INVENTOR(S) : Michael A. Haase It is certified that error appears in the above-identified patent and that said Letters Patent is hereby corrected as shown below:

Column 4,
Line 54, after "the" delete "a".
Line 56, after "the" delete "a".

Column 6,
Line 16, delete "Engineering" and insert -- Engineering, --, therefor.

Column 11,
Line 6, delete "thereof" and insert -- thereof. --, therefor.

Column 19,
Line 55, in Claim 1, delete "apTex," and insert -- apex --, therefor.

Signed and Sealed this

Twenty-ninth Day of September, 2009

David J. Kappos
*Director of the United States Patent and Trademark Office*